(12) United States Patent
Byun et al.

(10) Patent No.: US 12,297,532 B2
(45) Date of Patent: *May 13, 2025

(54) METAL CHALCOGENIDE FILM AND METHOD AND DEVICE FOR MANUFACTURING THE SAME

(71) Applicants: Samsung Electronics Co., Ltd., Suwon-si (KR); RESEARCH & BUSINESS FOUNDATION SUNGKYUNKWAN UNIVERSITY, Gyeonggi-Do (KR)

(72) Inventors: Kyung-Eun Byun, Seongnam-si (KR); Hyoungsub Kim, Seoul (KR); Taejin Park, Yongin-si (KR); Hyeonjin Shin, Suwon-si (KR); Hoijoon Kim, Daejeon (KR); Wonsik Ahn, Bucheon-si (KR); Mirine Leem, Suwon-si (KR)

(73) Assignees: Samsung Electronics Co., Ltd., Gyeonggi-do (KR); Research & Business Foundation Sungyunkwan University, Gyeonggi-do (KR)

( * ) Notice: Subject to any disclaimer, the term of this patent is extended or adjusted under 35 U.S.C. 154(b) by 10 days.

This patent is subject to a terminal disclaimer.

(21) Appl. No.: 18/332,638

(22) Filed: Jun. 9, 2023

(65) Prior Publication Data
US 2023/0313365 A1      Oct. 5, 2023

Related U.S. Application Data

(63) Continuation of application No. 16/861,614, filed on Apr. 29, 2020, now Pat. No. 11,708,633.

(30) Foreign Application Priority Data

May 2, 2019   (KR) .................. 10-2019-0051818

(51) Int. Cl.
*C23C 16/30*          (2006.01)
*B22F 7/00*           (2006.01)
                      (Continued)

(52) U.S. Cl.
CPC ............ *C23C 16/305* (2013.01); *B22F 7/008* (2013.01); *C23C 16/448* (2013.01);
(Continued)

(58) Field of Classification Search
None
See application file for complete search history.

(56) References Cited

U.S. PATENT DOCUMENTS

| 10,400,331 B2 | 9/2019 | Choi et al. |
| 2008/0121859 A1 | 5/2008 | Campbell |

(Continued)

FOREIGN PATENT DOCUMENTS

| KR | 20150098904 A | 8/2015 |
| KR | 10-2015-0129485 A | 11/2015 |

(Continued)

OTHER PUBLICATIONS

T. Park et al. 'Synthesis of Vertical MoO/MoS Core-Shell Structures on an Amorphous Substrate via Chemical Vapor Deposition' The Journal of Physical Chemistry, 2017, pp. 1-22.

(Continued)

*Primary Examiner* — Seth Dumbris
(74) *Attorney, Agent, or Firm* — Harness, Dickey & Pierce, P.L.C.

(57) ABSTRACT

Provided are a metal chalcogenide thin film and a method and device for manufacturing the same. The metal chalcogenide thin film includes a transition metal element and a chalcogen element, and at least one of the transition metal element and the chalcogen element having a composition gradient along the surface of the metal chalcogenide thin (Continued)

film, the composition gradient being an in-plane composition gradient. The metal chalcogenide thin film may be prepared by using a manufacturing method including providing a transition metal precursor and a chalcogen precursor on a substrate by using a confined reaction space in such a manner that at least one of the transition metal precursor and the chalcogen precursor forms a concentration gradient according to a position on the surface of the substrate; and heat-treating the substrate.

7 Claims, 14 Drawing Sheets

(51) Int. Cl.
  *C23C 16/448*    (2006.01)
  *C23C 16/455*    (2006.01)
  *C23C 16/46*     (2006.01)
  *H01L 21/02*     (2006.01)
  *H01L 21/285*    (2006.01)
  *H01L 31/032*    (2006.01)

(52) U.S. Cl.
  CPC .. *C23C 16/45502* (2013.01); *C23C 16/45514* (2013.01); *C23C 16/46* (2013.01); *H01L 21/02568* (2013.01); *H01L 21/02581* (2013.01); *H01L 21/28568* (2013.01); *H01L 31/0324* (2013.01); *B22F 2207/01* (2013.01); *B22F 2302/45* (2013.01)

(56) References Cited

U.S. PATENT DOCUMENTS

| | | | |
|---|---|---|---|
| 2011/0027940 A1 | 2/2011 | Oladeji | |
| 2012/0119177 A1* | 5/2012 | Erbetta | H10N 70/8828 257/E21.52 |
| 2012/0276725 A1 | 11/2012 | Imonigie et al. | |
| 2014/0264708 A1 | 9/2014 | Van Duren et al. | |
| 2017/0051400 A1 | 2/2017 | Choi et al. | |
| 2017/0330748 A1 | 11/2017 | Pickett et al. | |
| 2018/0037981 A1* | 2/2018 | Tas | C23C 14/541 |
| 2018/0158973 A1 | 6/2018 | Farshchi et al. | |

FOREIGN PATENT DOCUMENTS

| | | |
|---|---|---|
| KR | 10-2015-0134817 A | 12/2015 |
| KR | 10-2016-0093375 A | 8/2016 |
| KR | 101655898 B1 | 9/2016 |
| KR | 10-2017-0048873 A | 5/2017 |
| KR | 20170123929 A | 11/2017 |

OTHER PUBLICATIONS

X. Duan et al. 'Synthesis of $WS_{2x}Se_{2-2x}$ Alloy Nanosheets with Composition-Tunable Electronic Properties' Nano Letters, 2016, 16, pp. 264-269.

M. Zhang et al. 'Two-Dimensional Molybdenum Tungsten Diselenide Alloys: Photoluminescence, Raman Scattering, and Electrical Transport' ACSNANO, vol. 8, No. 7, 2014, pp. 7130-7137.

L. M. Xie 'Two-dimensional transition metal dichalcogenide alloys: preparation, characterization and applications' Nanoscale, 2013, 00, pp. 1-3.

S. Wang et al. 'Shape Evolution of Monolayer $MoS_2$ Crystals Grown by Chemical Vapor Deposition' Chemistry of Materials, 2014, 26, pp. 6371-6379.

X. Zhang et al. 'Shape-uniform, High-quality Monolayer MoS2 Crystals for Gate-tuneable Photoluminescence' Applied Materials & Interfaces, 2017, pp. 1-31.

Office action dated Nov. 1, 2022 for corresponding U.S. Appl. No. 16/861,614.

Office Action for Korean Application No. 10-2019-0051818 dated Dec. 18, 2023.

* cited by examiner ($MX_{2(1-y)} X'_{2y}$ THIN FILM)

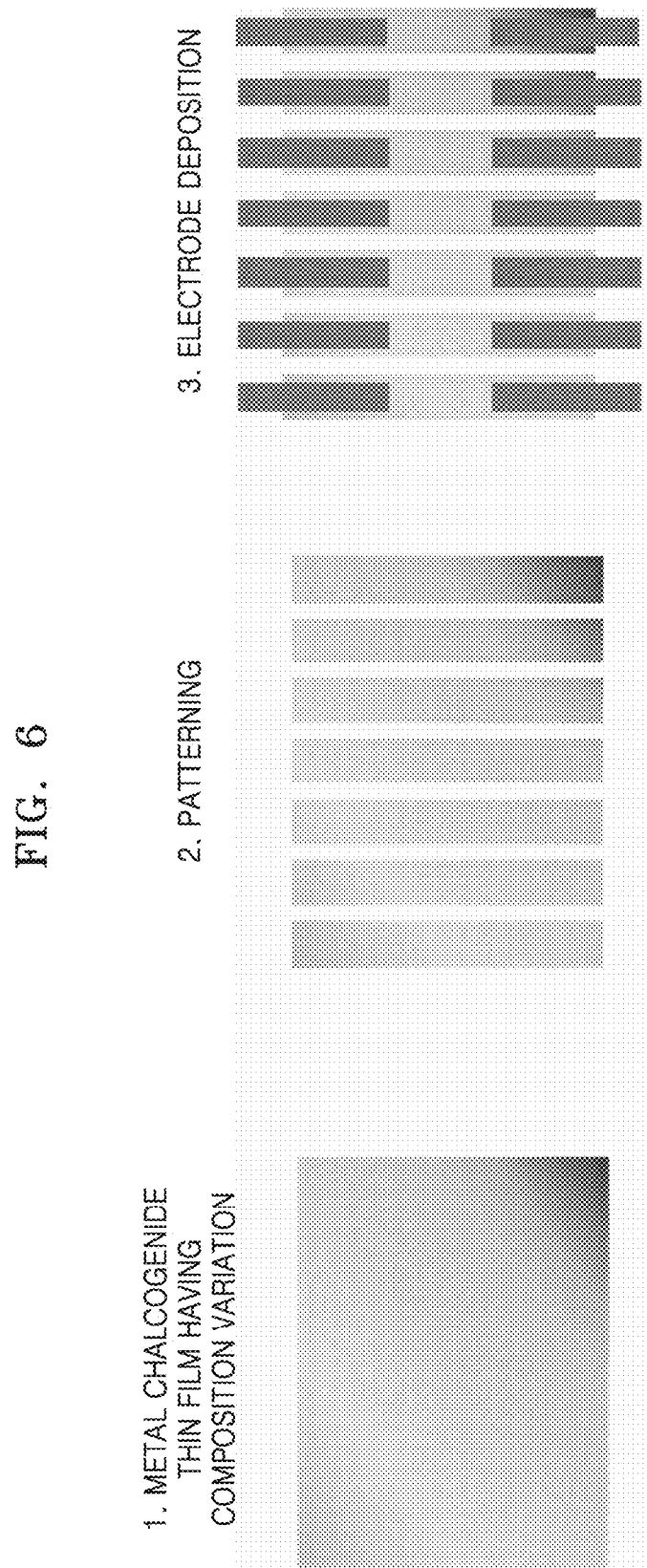

METAL CHALCOGENIDE FILM AND METHOD AND DEVICE FOR MANUFACTURING THE SAME

CROSS-REFERENCE TO RELATED APPLICATION

This application is a continuation of U.S. application Ser. No. 16/861,614, filed Apr. 29, 2020, which claims the benefit of and priority under 35 U.S.C. § 119 to Korean Patent Application No. 10-2018-0051818, filed on May 2, 2018 in the Korean Intellectual Property Office, the disclosure of which is incorporated herein in its entirety by reference.

BACKGROUND

1. Field

The present disclosure relates to metal chalcogenide thin films and methods and devices for manufacturing the same, and more particularly, to metal chalcogenide thin films having an in-plane composition gradient along a two-dimensional thin film, and methods and devices for manufacturing the same.

2. Description of Related Art

Elements belonging to Group 16 of the Periodic Table, for example, oxygen (O), sulfur (S), selenium (Se), tellurium (Te) and polonium (Po), may be referred to as oxygen group elements, from which the three elements of sulfur, selenium, and tellurium may also be elements of the sulfur group, or chalcogens.

Oxygen and sulfur are representative non-metallic elements, but as the atomic number increases, the other elements lose their non-metallicity and have enhanced metallicity. Selenium, tellurium, and polonium are rare elements, and polonium is a natural radioactive element.

Metal chalcogenides are compounds including a transition metal and a chalcogen, and may be a nanomaterial having a structure that is similar to graphene. The thickness of metal chalcogenides may be an atom-number thickness and may be very small. Thus, metal chalcogenides may be flexible and transparent, and in an electric aspect, shows similar properties of semiconductors, conductors, or the like.

Especially, in the case of semiconducting metal chalcogenide, due to an appropriate bandgap and electron mobility of several hundreds cd/V·s, semiconducting metal chalcogenides may be suitable for applications in semiconductor devices, for example as transistors, and have great potential for future flexible transistor devices.

$MoS_2$ and $WS_2$, which are among the most actively studied materials among metal chalcogenide materials, have a direct bandgap in a single-layer state, and thus, the absorption of light may efficiently occur, and thus, these materials may be suitable for the application to optical devices such as optical sensors and solar cells.

Methods of manufacturing such metal chalcogenide nano thin films have been actively studied recently. In order to apply such a metal chalcogenide thin film to the devices described above, for example, methods capable of synthesizing a thin film uniformly and continuously over a large area would be desired.

However, metal chalcogenide thin films with compositional variations may be beneficial. Due to the metal chalcogenide thin film having a compositional variation, the electric and optical bandgap may vary, and a region that is turned on (depending on the input energy band of an optical/electric signal) may be selectively formed, thus, enabling wavelength analysis and the use as an optical sensor, an electric switch, etc. Therefore, metal chalcogenide thin films having compositional deviations would have beneficial applications.

SUMMARY

An aspect of the some example embodiments provides metal chalcogenide thin films having a compositional variation.

Another aspect of the some example embodiments provides a method of manufacturing the metal chalcogenide thin films.

Another aspect of the some example embodiments provides a device for manufacturing the metal chalcogenide thin films.

Additional aspects will be set forth in part in the description which follows and, in part, will be apparent from the description, or may be learned by practice of the example embodiments.

According to an aspect of some example embodiments, provided is a metal chalcogenide thin film including a transition metal element and a chalcogen element, wherein at least one of the transition metal element and the chalcogen element has a composition gradient along a surface of the metal chalcogenide thin film, the composition gradient being an in-plane composition gradient.

According to another aspect of some example embodiments, provided is a method of preparing a metal chalcogenide thin film, the method including: providing a transition metal precursor and a chalcogen precursor on a substrate by using a confined reaction space, wherein at least one of the transition metal precursor and the chalcogen precursor forms a concentration gradient according to a position on a surface of a substrate; and heat treating the confined reaction space.

According to another aspect of some example embodiments, provided is a device for manufacturing the metal chalcogenide thin film described above, the device including: a confined reaction space configured to hold a substrate inside the confined reaction space or have the substrate form a side of the confined reaction space, the confined reaction space including at least one inlet configured to provide at least one of a transition metal precursor and a chalcogen precursor to form a concentration gradient according to a position on the surface of the substrate.

BRIEF DESCRIPTION OF THE DRAWINGS

These and/or other aspects will become apparent and more readily appreciated from the following description of the example embodiments, taken in conjunction with the accompanying drawings in which:

FIG. 6 shows examples in which a metal chalcogenide thin film according to some example embodiments is used as an element.

DETAILED DESCRIPTION

Figure 1A:
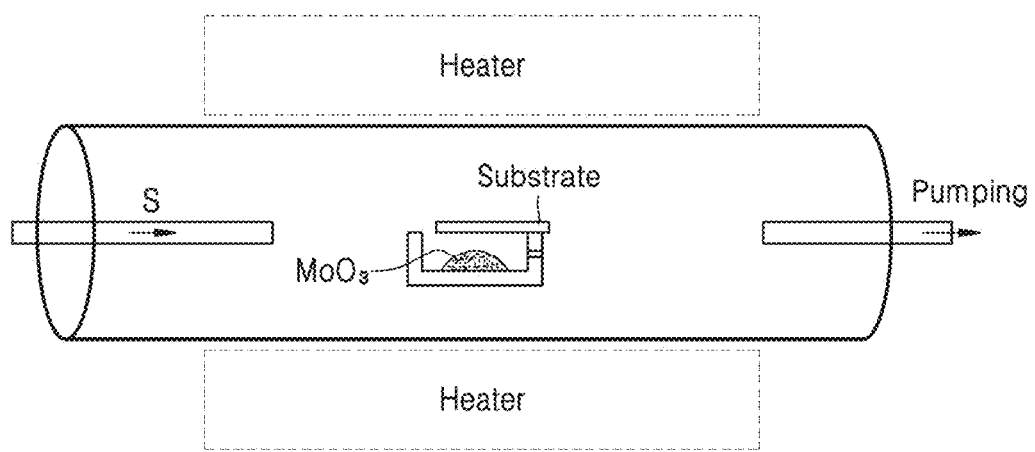
FIG. 1A shows a schematic view of a device for manufacturing a metal chalcogenide thin film according to some example embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The present inventive concepts will now be described more fully with reference to the accompanying drawings, in which example embodiments are shown. The present inventive concepts may, however, be embodied in many different forms, should not be construed as being limited to the example embodiments set forth herein, and should be construed as including all modifications, equivalents, and alternatives within the scope of the present inventive concept; rather, these embodiments are provided so that this inventive concepts will be thorough and complete, and will fully convey the effects and features of the present inventive concepts and ways to implement the present inventive concepts to those skilled in the art.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the drawings, the size or thickness of each layer, region, or element are arbitrarily exaggerated or reduced for better understanding or ease of description, and thus the present inventive concepts is not limited thereto. Throughout the written description and drawings, like reference numbers and labels will be used to denote like or similar elements. It will also be understood that when an element such as a layer, a film, a region or a component is referred to as being "on" another layer or element, it can be "directly on" the other layer or element, or intervening layers, regions, or components may also be present. Although the terms "first", "second", etc., may be used herein to describe various elements, components, regions, and/or layers, these elements, components, regions, and/or layers should not be limited by these terms. These terms are used only to distinguish one component from another, not for purposes of limitation.

It will be understood that, although the terms first, second, third, etc., may be used herein to describe various elements, components, regions, layers and/or sections, these elements, components, regions, layers and/or sections should not be limited by these terms.

In regard to manufacturing processes described herein, the manufacturing processes may not be carried out in the stated order. For example, in cases where a first step and a second step are described, it will be understood that the first step does not necessarily precede the second step.

Hereinafter, a metal chalcogenide thin film according to example embodiments, and a method and device for manufacturing the same will be described in more detail.

A metal chalcogenide thin film according to some example embodiments includes a transition metal element and a chalcogen element, and at least one of the transition metal element and the chalcogen element has a composition gradient along the surface of the metal chalcogenide thin film, that is, an in-plane composition gradient.

A metal chalcogenide compound exhibits different bandgaps depending on the composition ratio of transition metal alloy or chalcogen alloy. Unlike conventional metal chalcogenide thin films studied so far, which have a constant in-plane composition, in the case of the metal chalcogenide thin film according to some example embodiments, a location where a precursor of a transition metal element and/or a chalcogen element is provided is controlled by using a confined reaction space, thereby inducing a compositional variation according to a position of a thin film, that is, an in-plane composition gradient.

In the case of the metal chalcogenide thin film, a desired bandgap characteristic is obtained by forming an in-plane composition gradient in a single thin film by using an alloy of various transition metals and chalcogen elements. Thus, the metal chalcogenide thin film is applicable to various electronic elements, such as a light wavelength sensor.

In relation to the in-plane composition gradient of the metal chalcogenide thin film, a composition may continuously change from an element-rich region to an element-deficient region in a thin film.

According to some example embodiments, the metal chalcogenide thin film may include a composition represented by the following Formula 1.

$$M_{1-x}M'_xX_{2(1-y)}X'_{2y} \quad \text{[Formula 1]}$$

wherein M and M' are different transition metal elements, X and X' are different chalcogen elements, 0≤x<1, and 0≤y<1, and at least one of x and y is not 0.

The transition metal element may be selected from, for example, Ti, Zr, Hf, V, Nb, Ta, Mo, W, Tc, Re, Co, Rh, Ir, Ni, Pd, Pt, Zn, and/or Sn, and may be, for example, Mo, W, V, Nb, and/or the like.

The chalcogen element may be selected from, for example, S, Se, and/or Te.

In this regard, at least one of the transition metal element and the chalcogen element shows a composition gradient along the surface of the thin film. In other words, x or y, or x and y, may be continuously changed along the surface of the metal chalcogenide thin film.

The metal chalcogenide thin film may include, for example, a composition represented by Formula 2.

$$Mo_{1-x}W_xS_{2(1-y)}Se_{2y} \quad \text{[Formula 2]}$$

wherein 0≤x<1 and 0≤y<1, and at least one of x and y is not 0.

According to some example embodiments, the transition metal element and the chalcogen element may each exhibit an in-plane composition gradient. At this time, the composition gradient of the transition metal element and the composition gradient of the chalcogen element may be perpendicular to each other along the surface of the metal chalcogenide thin film.

According to some example embodiments, the metal chalcogenide thin film may have a thickness variation as well as the compositional variation in a plane thereof. For example, in regard to the composition gradient of the metal chalcogenide thin film, the thickness of the element-rich region may be greater than that of the element-deficient region, and the thickness of the metal chalcogenide thin film may decrease substantially continuously from the element-rich region to the element-deficient region. As described above, by having not only the compositional variation but also the thickness variation, the bandgap change characteristic according to the position of a thin film may be better controlled.

The metal chalcogenide thin film can be applied to an electronic element such as an optical wavelength sensor having a desired bandgap region. Due to such a characteristic of the metal chalcogenide thin film that the electric and optical bandgap changes according to a compositional deviation, a region that is turned on depending on the input energy band of an optical/electric signal is selectively generated, enabling wavelength analysis and the use as an optical sensor, an electric switch, etc.

Figure 5:
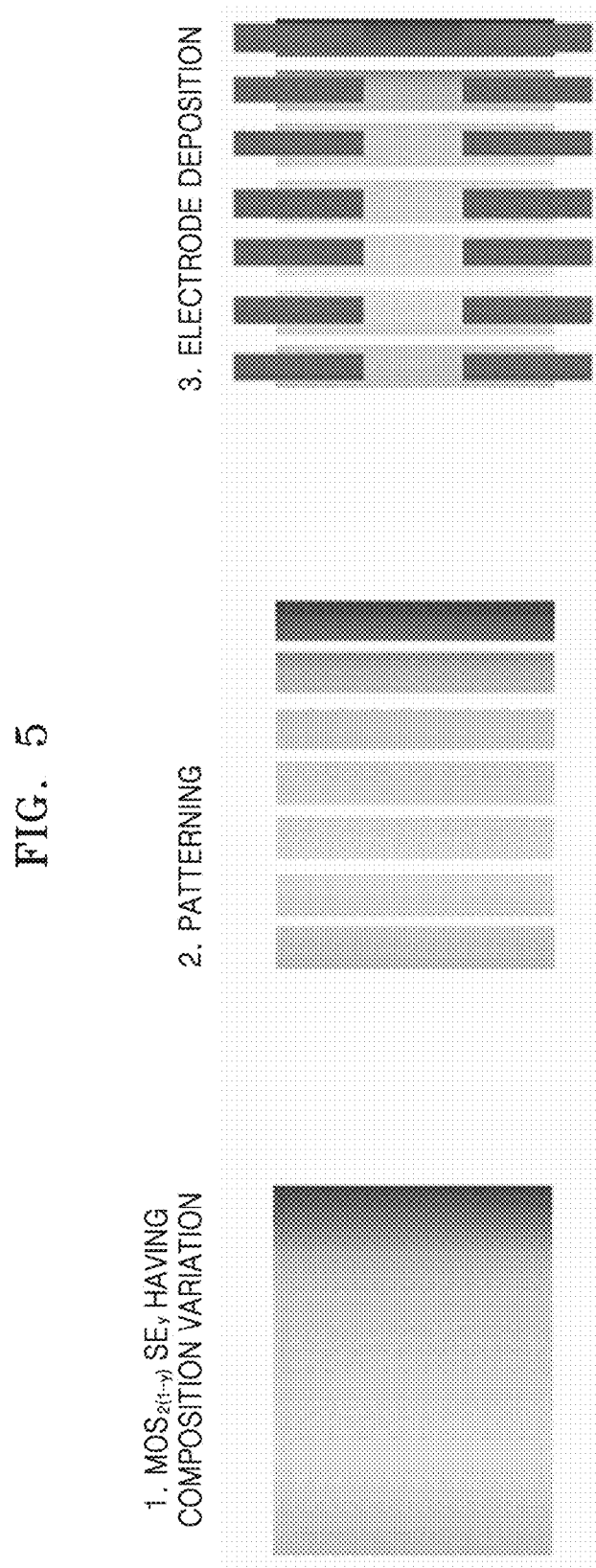
FIG. 5 shows examples in which a metal chalcogenide thin film according to some example embodiments is used as an element.

For example, as shown in FIG. 5, when a metal chalcogenide thin film having the composition $MoS_{2(1-y)}Se_y$ is taken as an example, when transition metal regions having different bandgaps according to the composition variation are patterned and separated, and then, an electrode is attached on each of the transition metal regions, a region that undergoes channeling according to a characteristic of radiated light is generated, enabling wavelength analysis and the use as an optical sensor. In this regard, when the composition of the transition metal or chalcogen is increased, the bandgap energy band may be further expanded. For example, when $MoS_2$ is used alone, the bandgap may be from about 1.3 eV to about 1.8 eV, and once an element is introduced, the bandgap may be widened from about 0.8 eV to about 3.5 eV.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

For example, as shown in FIG. 6, when a metal chalcogenide thin film having the composition having a composition gradient in two directions is taken as an example, when transition metal regions having different bandgaps according to the composition variation are patterned and separated, and then, an electrode is attached on each of the transition metal regions, a region that undergoes channeling according to a characteristic of radiated light is generated, enabling wavelength analysis and the use as an optical sensor. In this regard, when the composition of the transition metal or chalcogen is increased, the bandgap energy band may be further expanded. For example, when $MoS_2$ is used alone, the bandgap may be from about 1.3 eV to about 1.8 eV, and once an element is introduced, the bandgap may be widened from about 0.8 eV to about 3.5 eV.

Such a metal chalcogenide thin film may be produced by using the following method using a confined reaction space.

A method of manufacturing the metal chalcogenide thin film according to some example embodiments includes:

providing a transition metal precursor and a chalcogen precursor on a substrate by using a confined reaction space, wherein at least one of the transition metal precursor and the chalcogen precursor forms a concentration gradient according to a position on the surface of the substrate; and heat treating the confined reaction space.

Herein, the wording "confined reaction space" refers to a space that is smaller than a general reaction chamber, and a space in which a metal chalcogenide compound is formed on a substrate by reacting a transition metal precursor and a chalcogen precursor, is limited by, for example, a container. To make a desired concentration variation of a precursor within the space, the size and shape of the space, the location of an inlet, the location of an outlet, and the loading and discharging speed of a precursor, etc. are controlled to make a target design change.

By using the confined reaction space, at least one of the transition metal precursor and the chalcogen precursor may be provided to form a concentration gradient depending on a position on the surface of the substrate. To this end, at least one of the transition metal precursor and the chalcogen precursors may be provided in a vapor phase in a horizontal direction on the surface of the substrate. By doing so, during the deposition of the metal chalcogenide compound, the composition gradient of a precursor is formed along the position on the surface of the substrate, and thus, the precursor may be grown into a metal chalcogenide thin film having an in-plane composition gradient in a single thin film.

The substrate may be placed inside or on one side of the confined reaction space.

The substrate is a supporting substrate for growing a metal chalcogenide thin film, and may include at least one selected from silicon, silicon oxide, aluminum oxide, magnesium oxide, silicon carbide, silicon nitride, glass, quartz, sapphire, graphite, graphene, polyimide copolymer, polyimide, polyethylene naphthalate (PEN), fluoropolymer (FEP), and/or polyethylene terephthalate (PET).

The substrate may include, for example, a silicon (Si) substrate. At this time, silicon oxide may further be positioned on the Si substrate.

The substrate may be placed inside a confined reaction space, or an open side of a reaction vessel may be covered by a substrate to form a confined reaction space The confined reaction space with the substrate provided may be heat-treated at a temperature which is suitable for the growth of a thin film by using a separate heater.

The confined reaction space may be provided with an inlet through which a transition metal precursor and/or a chalcogen precursor is provided, and at least one of the transition metal precursor and the chalcogen precursor may be provided to form a concentration gradient depending on the position on the surface of the substrate.

The transition metal precursor may include at least one element selected from Ti, Zr, Hf, V, Nb, Ta, Mo, W, Tc, Re, Co, Rh, Ir, Ni, Pd, Pt, Zn, and/or Sn. For example, the transition metal precursor may include a metal oxide, a metal halide, a metal carbonyl compound, and/or a combination thereof, each including the element.

An example of the metal oxide may include at least one selected from $MoO_3$, $MoO$, $MoO_2$, $WO_2$, $WO_3$, $VO$, $VO_2$, $V_2O_3$, $V_2O_5$, $V_3O_5$, $NbO$, $NbO_2$, $Nb_2O_5$, $TaO$, $TaO_2$, $Ta_2O_5$, $TiO$, $TiO_2$, $Ti_2O_3$, $Ti_3O_5$, $ZrO_2$, $HfO_2$, $TcO_2$, $Tc_2O_7$, $ReO_2$, $ReO_3$, $Re_2O_3$, $Re_2O_7$, $CoO$, $Co_2O_3$, $Co_3O_4$, $Rh_2O_3$, $RhO_2$, $IrO_2$, $Ir_2O_3$, $IrO_2 \cdot 2H_2O$, $NiO$, $Ni_2O_3$, $PdO$, $PdO_2$, $PtO$, $PtO_2$, $PtO_3$, $Pt_3O_4$, $PtO_2 \cdot H_2O$, $GaO$, $Ga_2O$, $Ga_2O_3$, $SnO$, and/or $SnO_2$.

An example of the metal halide may include at least one selected from $MoF_3$, $MoF_6$, $MoF_4$, $Mo_4F_{20}$, $MoCl_2$, $MoCl_3$, $MoCl_6$, $MoCl_4$, $MoCl_5$, $MoBr_3$, $MoBr_4$, $MoI_2$, $MoI_3$, $MoI_4$, $WF_6$, $WF_4$, $[WF_5]_4$, $WCl_2$, $WCl_6$, $WCl_4$, $[WCl_5]_2$, $[W_6Cl_{12}]Cl_6$, $WBr_3$, $WBr_6$, $WBr_4$, $WBr_5$, $W_6Br_{14}$, $WI_2$, $WI_3$, $WI_4$, $VF_2$, $VF_3$, $VF_4$, $VF_5$, $VC_{12}$, $VC_{13}$, $VC_{14}$, $VBr_2$, $VBr_3$, $VBr_4$, $VI_2$, $VI_3$, $VI_4$, $NbCl_3$, $NbCl_4$, $NbCl_5$, $NbBr_4$, $NbBr_5$, $NbI_3$, $NbI_4$, $NbI_5$, $TaF_3$, $[TaF_5]_4$, $TaCl_3$, $TaCl_4$, $TaCl_5$, $TaBr_3$, $TaBr_4$, $TaBr_5$, $TaI_4$, $TaI_5$, $TiF_2$, $TiF_3$, $TiF_4$, $TiCl_4$, $TiCl_3$, $TiCl_2$, $TiBr_3$, $TiBr_4$, $HfCl_4$, $HfBr_2$, $HfBr_4$, $HfI_3$, $HfI_4$, $ZrF_4$, $ZrCl_2$, $ZrCl_3$, $ZrCl_4$, $ZrBr_3$, $ZrBr_4$, $ZrI_2$, $ZrI_3$, $ZrI_4$, $TcF_6$, $TcF_5$, $TcCl_4$, $TcCl_6$, $TcBr_4$, $ReF_6$, $ReF_4$, $ReF_5$, $ReF_7$, $Re_3Cl_9$, $ReCl_5$, $ReCl_4$, $ReCl_6$, $ReBr_3$, $ReBr_4$, $ReBr_5$, $ReI_3$, $ReI_4$, $CoF_2$, $CoF_3$, $CoF_4$, $CoCl_2$, $CoCl_3$, $CoBr_2$, $CoI_2$, $RhF_3$, $RhF_6$, $RhF_4$, $[RhF_5]_4$, $RhCl_3$, $RhBr_3$, $RhI_3$, $IrF_3$, $IrF_6$, $IrF_4$, $[IrF_5]_4$, $IrCl_2$, $IrCl_3$, $IrCl_4$, $IrBr_2$, $IrBr_3$, $IrBr_4$, $IrI_2$, $IrI_3$, $IrI_4$, $NiF_2$, $NiCl_2$, $NiBr_2$, $NiI_2$, $PdF_2$, $PdF_4$, $PdCl_2$, $PdBr_2$, $PdI_2$, $PtF_6$, $PtF_4$, $[PtF_5]_4$, $PtCl_2$, $PtCl_3$, $PtCl_4$, $Pt_6Cl_{12}$, $PtBr_2$, $PtBr_3$, $PtBr_4$, $PtI_2$, $PtI_3$, $PtI_4$, $GaF_3$, $GaCl_2$, $GaCl_3$, $GaBr_3$, $GaI_3$, $SnF_2$, $SnF_4$, $SnCl_2$, $SnCl_4$, $SnBr_2$, $SnBr_4$, $SnI_2$, and/or $SnI_4$.

An example of the metal carbonyl compound may include at least one selected from $Mo(CO)_6$, $W(CO)_6$, $Nb(CO)_6$, $V(CO)_6$, $Ta(CO)_6$, $Ti(CO)_6$, $Zr(CO)_7$, $Tc_2(CO)_{10}$, $Hf(CO)_7$, $Re_2(CO)_{10}$, $Co_2(CO)_8$, $Co_4(CO)_{12}$, $Co_6(CO)_{16}$, $Rh_2(CO)_8$, $Rh_4(CO)_{12}$, $Rh_6(CO)_{16}$, $Ir_2(CO)_8$, $Ir_4(CO)_{12}$, $Ir_6(CO)_{16}$, $Ni(CO)_4$, $Pd(CO)_4$, and/or $Pt(CO)_4$.

For the transition metal precursor, a precursor in a vapor state may be used, or a precursor in a powder state such as molybdenum oxide ($MoO_3$) may be vaporized and then provided on a substrate.

The chalcogen precursor may include at least one element selected from S, Se, and/or Te.

The chalcogen precursor may include at least one selected from, for example, sulfur, hydrogen sulfide ($H_2S$), diethyl sulfide, dimethyl disulfide, ethyl methyl sulfide, $(Et_3Si)_2S$, selenium vapor, hydrogen selenide ($H_2Se$), diethyl selenide, dimethyl diselenide, ethyl methyl selenide, $(Et_3Si)_2Se$, tellenium vapor, hydrogen telluride ($H_2Te$), dimethyl telluride, diethyl telluride, ethyl methyl telluride, and/or $(Et_3Si)_2Te$.

The chalcogen precursor may include, for example, a chalcogen-containing gas, such as $S_2$, $H_2S$, $Se_2$, $Te_2$, $H_2Se$, $H_2Te$, and/or the like.

FIG. 1A shows a schematic view of an example of a device for manufacturing a metal chalcogenide thin film according to some example embodiments.

As illustrated in FIG. 1A, for example, when a transition metal precursor in a powder state, such as $MoO_3$, is used to form a concentration gradient according to a position on the surface of a substrate, the substrate is arranged to form one side of a confined reaction space, and the transition metal precursor in a powder state is placed on an inner bottom of the confined reaction space to face the substrate. To this end, a transition metal precursor in a powder state, such as $MoO_3$, is placed inside an open reaction vessel, which is then covered with a substrate to form a confined reaction space.

In this case, when the transition metal precursor in a powder state is vaporized by heating, due to the location of the transition metal precursor placed close to the center of the substrate, the transition metal precursor has a high concentration at the center of the substrate and has a smaller concentration away from the center of the substrate by diffusion.

Figure 1B:
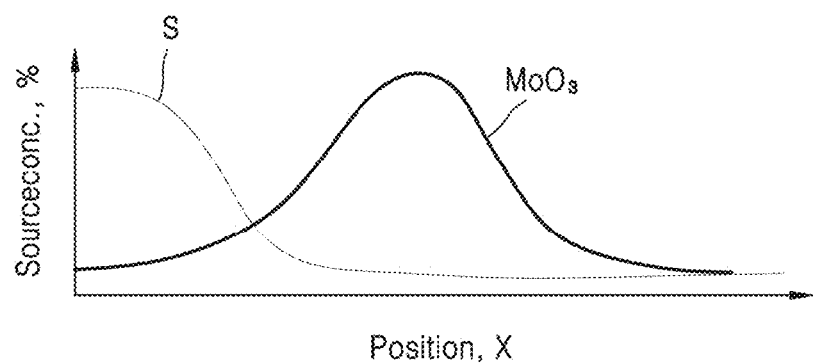
FIG. 1B shows a graph of the concentration of a precursor with respect to a position on the substrate in the manufacturing device.

When the transition metal precursor in a powder state is vaporized and diffused by heating, as illustrated in FIG. 1B, in regard to the surface of the substrate, a region that is closer to the location of the transition metal precursor may be controlled to have a high concentration of the precursor, and a region that is farther from the location of the transition metal precursor may be controlled to have a low concentration of the precursor.

At this time, the chalcogen precursor may be injected in a vapor state such as sulfur gas into the confined reaction space while the concentration thereof is maintained constant. In other example embodiments, the chalcogen precursor may be provided to form a concentration gradient.

For example, as illustrated in FIG. 1A, when the chalcogen precursor, such as sulfur (S) gas, is injected at a high concentration through an inlet formed between the confined reaction space and the substrate and discharged at a high speed through an outlet located opposite to the inlet of the confined reaction space, as illustrated in FIG. 1B, of the surface of the substrate, a region that is closer to the inlet has a higher concentration of the S precursor, and a region that is closer to the outlet has a lower concentration of the S precursor, that is, a concentration gradient may be formed.

When the transition metal precursor and the chalcogen precursor are provided in the concentration conditions described with reference to FIG. 1B by using the manufacturing device of FIG. 1A, a metal chalcogenide thin film having the in-plane composition gradient shown in FIG. 1C may be formed. This is a metal chalcogenide thin film prepared according to Example 1, to be described later.

Figure 1C:
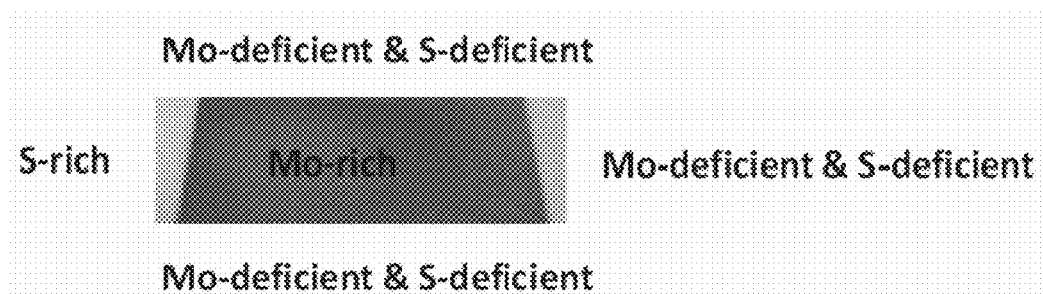
FIG. 1C shows an image of a metal chalcogenide thin film manufactured by using the manufacturing device.

As shown in FIG. 1C, a metal chalcogenide thin film may be formed in which a region having a high concentration of the transition metal precursor is rich with Mo (indicated by Mo-rich) and a region having a low concentration of the transition metal precursor is deficient with Mo (indicated by Mo-deficient). When a precursor is provided with the concentration gradient as illustrated in FIG. 1B, a metal chalcogenide thin film may be formed in which a Mo-rich region is formed at the center thereof and a Mo-deficient region is formed away from the center thereof, a left portion is S-rich, and a right portion is S-deficient.

When the metal chalcogenide thin film of FIG. 1C has a thickness variation as well as the composition gradient, in the Mo-rich region at the center of the metal chalcogenide thin film, more $MoS_2$ may be deposited, and away from the center of the metal chalcogenide thin film, less $MoS_2$ may be deposited.

Figure 1D:
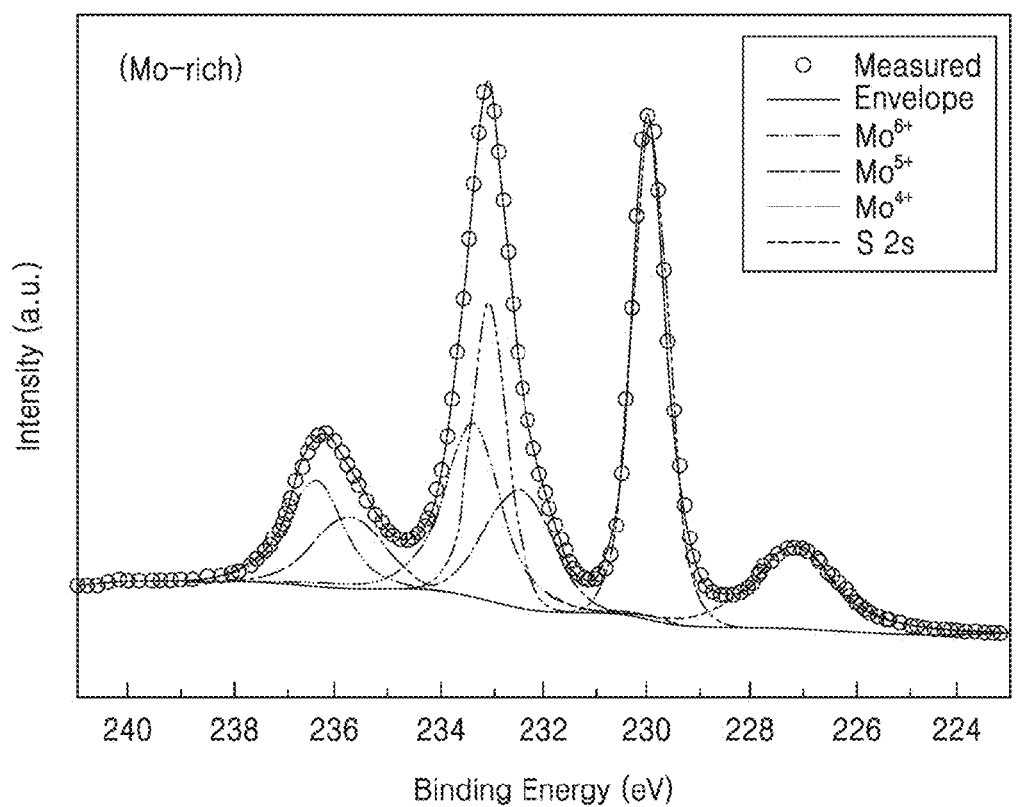
FIG. 1D is a graph showing results obtained by measuring binding energy at a Mo-rich region of the metal chalcogenide thin film.
Figure 1E:
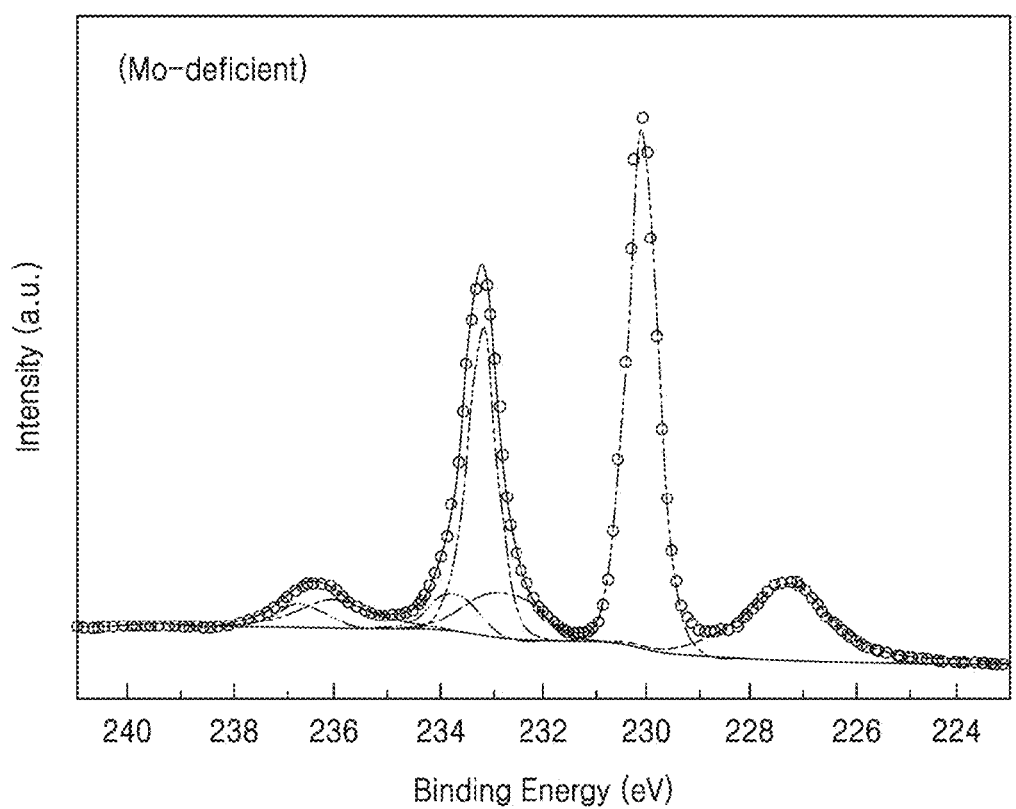
FIG. 1E is a graph showing results obtained by measuring binding energy at a Mo-deficient region of the metal chalcogenide thin film.

The results obtained by measuring the binding energy of the Mo-rich region and the Mo-deficient region of the metal chalcogenide thin film are shown in FIG. 1D and FIG. 1E, respectively.

By changing the position of the transition metal precursor in a powder state, the position of the maximum concentration of the corresponding transition metal element may be changed. For example, the transition metal precursor in a powder state may be arranged to be vertically spaced from the surface of the substrate.

According to some example embodiments, the transition metal precursor may have a concentration gradient with the greatest concentration in the middle of the surface of the substrate, or the greatest concentration may be at another point on the surface of the substrate. Additionally, the chalcogenide may have a concentration gradient with the greatest concentration at any point along the surface of the substrate. In some example embodiments there may be two or more areas with the greatest concentration of a transition metal precursor and/or a chalcogenide.

In another example embodiment, the transition metal precursor and/or the chalcogenide may have a concentration gradient along two axis of the substrate, such that a concentration gradient changes along a first direction and a concentration gradient change along a second direction. For example, a point on the surface of the substrate may have a greatest concentration, and the concentration may go down in a first direction according to a first concentration gradient, and may go down in a second direction according to a second concentration gradient.

According to some example embodiments, two or more different kinds of transition metal precursors or chalcogen precursors may be introduced in a vapor state into the confined reaction space in different directions to form a concentration gradient according to a position on the surface of the substrate.

Figure 2A:
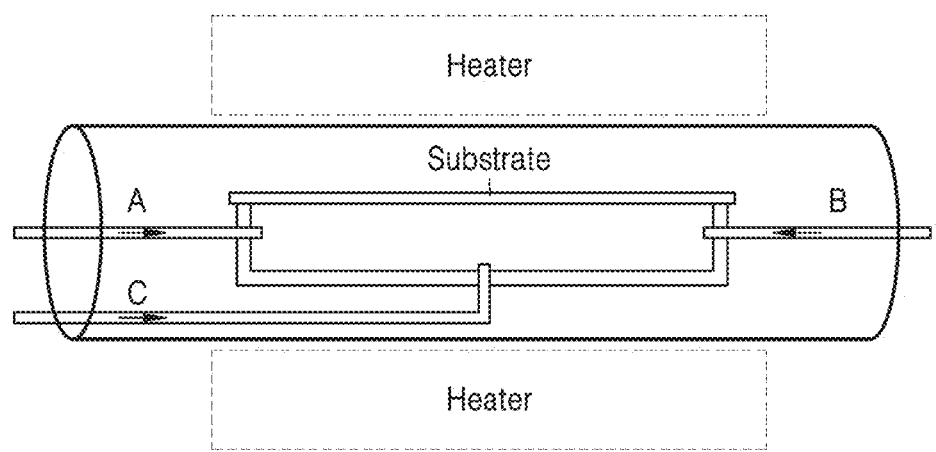
FIG. 2A shows a schematic view of a device for manufacturing a metal chalcogenide thin film according to some example embodiments.

FIG. 2A shows a schematic view of an example of a device for manufacturing a metal chalcogenide thin film according to some example embodiments.

As shown in FIG. 2A, the substrate is placed to form one side of a confined reaction space. For example, an upper portion of an open reaction vessel may be covered with the substrate. Through inlets (A and B) at opposite sides of the confined reaction space, two different kinds of transition metal precursors (M source and M' source) are injected in a vapor state in opposite directions to form a concentration gradient according to the position on the surface of the substrate.

In some example embodiments, a transition metal precursor (X source) may be injected in a vapor state in such a manner that the concentration thereof is maintained constant regardless of a position on the surface of the substrate. In this case, the inlet C for the transition metal precursor may be formed in a lower surface of the confined reaction space, but the location of the inlet C is not limited thereto.

Figure 2B:
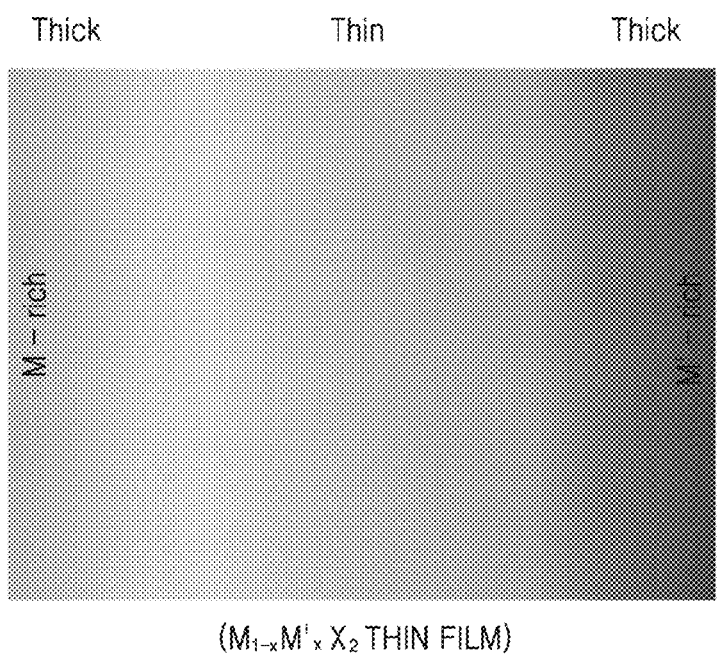
FIG. 2B shows an image of a metal chalcogenide thin film manufactured by using the manufacturing device, wherein the composition and thickness of a transition metal element continuously change.

When a transition metal precursor and a chalcogen precursor are provided by using the manufacturing device of FIG. 2A, as shown in FIG. 2B, a metal chalcogenide thin film having the composition $M_{1-x}M'_xX_2$ (where 0<x<1) may be formed to have an in-plane composition gradient in which a left portion is M-rich and a right portion is M'-rich. Here, the metal chalcogenide thin film may have a thickness variation in which the M-rich region and the M'-rich region are each thick and the central portion is thin.

Figure 3A:
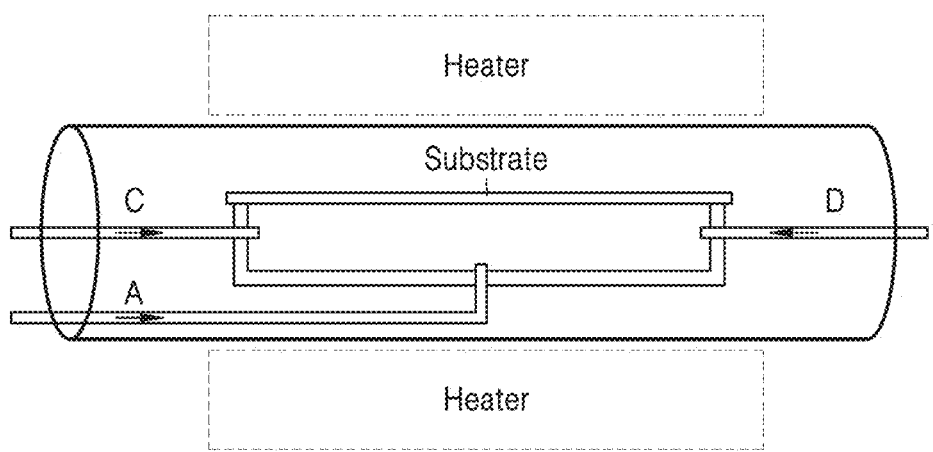
FIG. 3A shows a schematic view of a device for manufacturing a metal chalcogenide thin film according to some example embodiments.

FIG. 3A shows a schematic view of an example of a device for manufacturing a metal chalcogenide thin film according to some example embodiments.

As shown in FIG. 3A, the substrate is placed on one side of a confined reaction space. Through inlets (C and D) at opposite sides of the confined reaction space, two different kinds of chalcogen precursors (X source and X' source) are injected in a vapor state in opposite directions to form a concentration gradient according to a position on the surface of the substrate. In some example embodiments, a chalcogen precursor (M source) may be injected in a vapor state in such a manner that the concentration thereof is maintained constant regardless of a position on the surface of the substrate. In this case, the inlet A for the chalcogen precursor may be formed in a lower surface of the confined reaction space, but the location of the inlet A is not limited thereto.

Figure 3B:
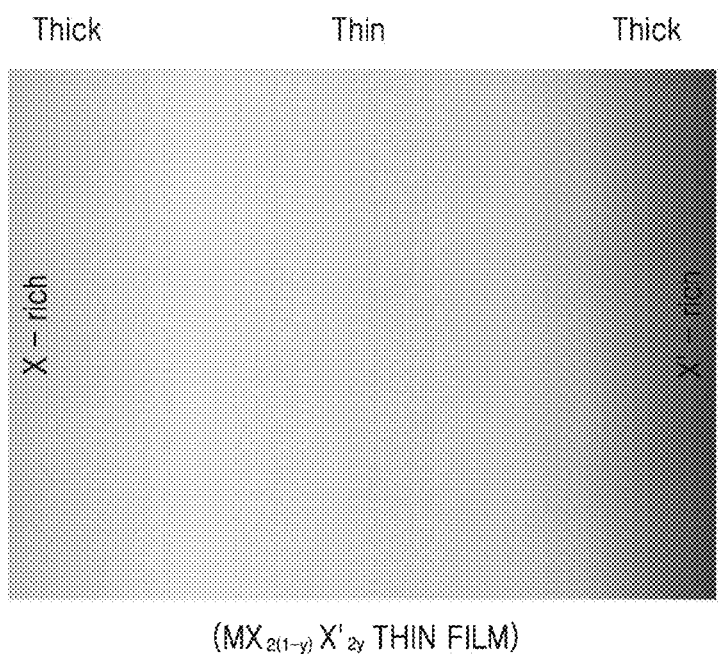
FIG. 3B shows an image of a metal chalcogenide thin film manufactured by using the manufacturing device, wherein the composition and thickness of a chalcogen element continuously change.
Figure 4:
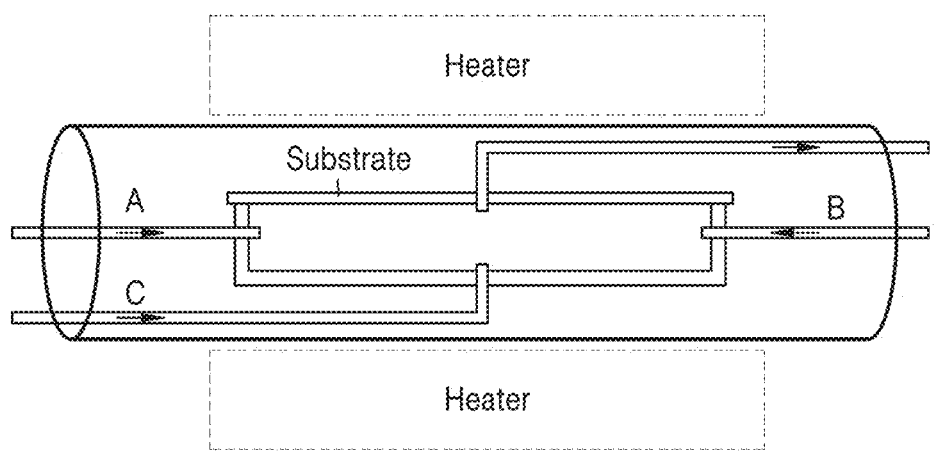
FIG. 4 shows a schematic view of a device for manufacturing a metal chalcogenide thin film according to some example embodiments.

When a transition metal precursor and a chalcogen precursor are provided by using the manufacturing device of FIG. 3A, as shown in FIG. 3B, a metal chalcogenide thin film having the composition $MX_{2(1-y)}X'_{2y}$, (where 0<y<1) may be formed to have an in-plane composition gradient in which a left portion is X-rich and a right portion is X'-rich. Here, the metal chalcogenide thin film may have a thickness variation in which the X-rich region and the X'-rich region are each thick and the central portion is thin.

According to some example embodiments, a substrate is placed on one side of a confined reaction space, two different kinds of transition metal precursors are injected in a vapor state in opposite directions of the confined reaction space to form a concentration gradient according to a position on the surface of a substrate, and also, two different kinds of chalcogen precursors are injected in a vapor state in opposite directions of the confined reaction space to form a concentration gradient according to a position on the surface of the substrate. Here, the directions in which the transition metal precursors and the chalcogen precursors are injected may be perpendicular to each other.

As such, formed are four or more components of a metal chalcogenide thin film in which the transition metal and the chalcogen element each have a composition gradient. The metal chalcogenide thin film may have the composition represented by $M_{1-x}M'_xX_{2(1-y)}X'_{2y}$, (where 0<x<1 and 0<y<1).

In regard to the method of manufacturing the metal chalcogenide thin film, in the confined reaction space to which the transition metal precursor and the chalcogen precursor are provided, a 2-dimensional metal chalcogenide thin film may be grown by a heat treatment.

According to some example embodiments, the heat treatment may be performed at a temperature higher than the volatilization temperature of a transition metal precursor used in the manufacture of a thin film. For example, in the case of $MoS_2$, when the heat treatment temperature is 750° C. or higher, the volatilization of a $MoO_3$ precursor may be induced, and in a vaporized sulfur gas atmosphere, a metal chalcogenide thin film is grown in a two-dimensional plane. At the heat treatment temperature lower than 750° C., when the $MoO_3$ precursor is exposed to vaporized sulfur gas, the $MoO_3$ precursor may not be volatilized and may itself be reduced into a metal oxide, such as $MoO_2$, or after the metal oxide is formed on the substrate, the metal oxide is sulfided and instead of the growth of a thin film on the substrate, a vertically grown metal chalcogenide may be formed. In the case of $MoS_2$, the heat treatment may be performed in a range of about 750° C. to about 1100° C., or 750° C. to 1100° C.

A device for manufacturing a metal chalcogenide thin film according to some example embodiments includes a confined reaction space, and a substrate placed inside the confined reaction space or on one side of the confined reaction space, wherein the confined reaction space has at least one inlet through which at least one of a transition metal precursor and a chalcogen precursor is provided to form a concentration gradient according to a position on the surface of a substrate.

By using the manufacturing device, a metal chalcogenide thin film may be formed in which at least one of a transition metal element and a chalcogen element shows a composition gradient along the surface of the metal chalcogenide thin film, that is, an in-plane composition gradient.

According to some example embodiments, the inlet may be formed in a side surface of the confined reaction space in such a manner that at least one of the transition metal precursor and the chalcogen precursor is provided in a vapor state in a direction parallel to the surface of the substrate.

According to some example embodiments, the confined reaction space may further include an outlet for controlling the concentration of one of the transition metal precursor and the chalcogen precursor.

Examples of the device for manufacturing the metal chalcogenide thin film according to various example embodiments are schematically illustrated in FIGS. 1A, 2A, 3A, and 4, but are not limited thereto.

Example embodiments are explained in detail through Examples and Comparative Examples. It should be noted, however, that the example embodiments are for illustrative purposes only and are not intended to limit the scope of the present disclosure.

Example 1

By using the manufacturing device schematically illustrated in FIG. 1A, a transition metal precursor and a chalcogen precursor are provided according to a concentration condition for a substrate as illustrated in FIG. 1B to form a metal chalcogenide thin film having an in-plane composition gradient and the composition $MoS_2$.

In detail, 30 mg of $MoO_3$ powder and 80 mg of S powder were used to manufacture a $MoS_2$ thin film. A substrate was located on top of a crucible containing $MoO_3$ powder to allow volatilized $MoO_x$ gas to maintain a high partial pressure in a space confined by the crucible and the substrate, and before the crucible, Ar gas was used as a carrying gas to smoothly provide the volatilized sulfur gas, and sulfur provided by the carrying gas was reacted with a high concentration of $MoO_x$ gas, thereby completing the manufacture of a metal chalcogenide thin film having an in-plane Mo concentration gradient and sulfur concentration gradient. For a smooth production, the process was carried out at a temperature of 780° C. for 10 minutes, and the process pressure was 1 Torr.

An image of the metal chalcogenide thin film prepared according to Example 1 is shown in FIG. 1C. As shown in FIG. 1C, a metal chalcogenide thin film may be formed in which a Mo-rich region is located at the center (where $MoO_3$ is located) thereof, and away from the center of the thin film, Mo is deficient, and an S-deficient composition gradient may be formed from close to the inlet of sulfur to away from the inlet of the sulfur.

FIG. 1D is a graph showing the results obtained by measuring the binding energy of the Mo-rich region of the metal chalcogenide thin film, and FIG. 1E is a graph showing the results obtained by measuring the binding energy of the Mo-deficient region of the metal chalcogenide thin film.

As can be seen from FIG. 1D and FIG. 1E, the total amount of $Mo^{6+}Mo6+$ and $Mo^{5+}$ observed in the Mo-rich region is greater than that in the Mo-deficient region, indicating that Mo in the Mo-rich region is richer than in the Mo-deficient region.

Figure 1F:
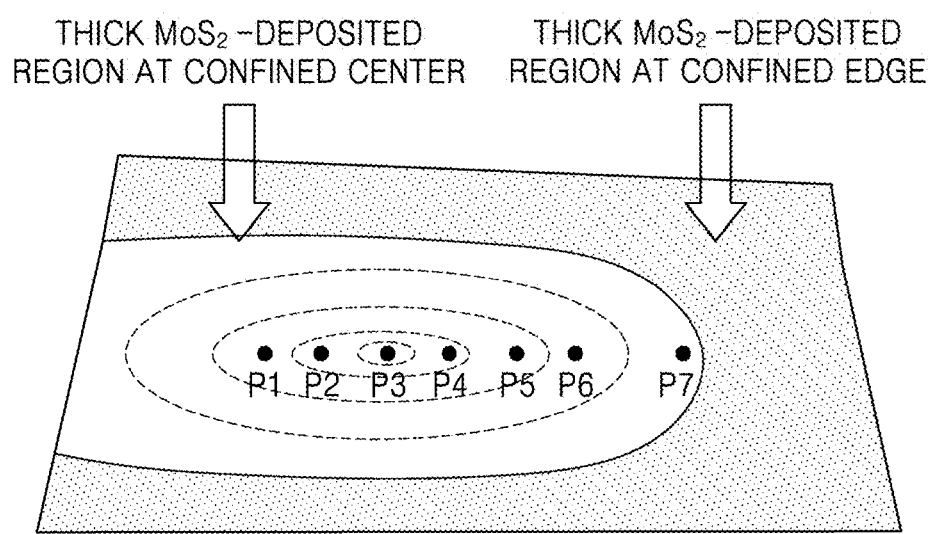
FIG. 1F shows positions for the measurement of the thickness difference and the optical bandgap according to a region of the metal chalcogenide thin film.
Figure 1G:
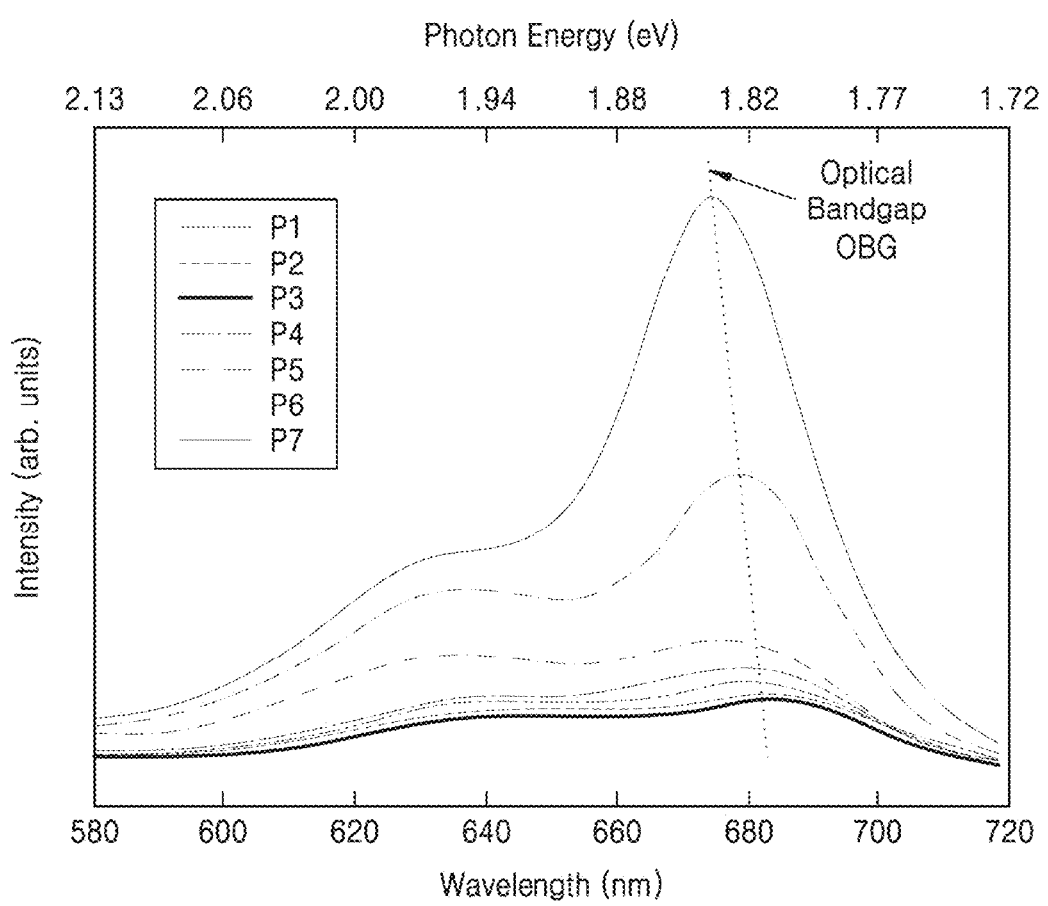
FIG. 1G shows a graph of a result of the measurement of the optical bandgap of the metal chalcogenide thin film according to the position on the metal chalcogenide thin film.

To identify an optical bandgap according to a position on the metal chalcogenide thin film, luminescence spectra were measured by using a WITEC Alpha 300R at the positions P1 to P7 shown in FIG. 1F, and the results are shown in FIG. 1G.

As shown in FIG. 1G, it can be seen that the optical bandgap OBG of the thin film changes from 1.82 eV to 1.85 eV depending on the position, and from the results, it was confirmed that the optical bandgap changes depending on the concentrations of Mo and S.

A metal chalcogenide thin film according to some example embodiments has a composition gradient along the surface thereof, that is, an in-plane composition gradient, thereby achieving various desired bandgap characteristics. The metal chalcogenide thin film may be easily prepared by using a confined reaction space.

It should be understood that example embodiments described herein should be considered in a descriptive sense only and not for purposes of limitation. Descriptions of features or aspects within each example embodiment should typically be considered as available for other similar features or aspects in other example embodiments. While one or more example embodiments have been described with reference to the figures, it will be understood by those of ordinary skill in the art that various changes in form and details may be made therein without departing from the spirit and scope as defined by the following claims.

What is claimed is:

1. A device comprising:
a metal chalcogenide thin film; and
at least one electrodes,
wherein the metal chalcogenide film comprises:
   a transition metal element; and
   a chalcogen element,
wherein at least one of the transition metal element and the chalcogen element has a composition gradient along an upper surface of the metal chalcogenide thin film, the composition gradient being an in-plane composition gradient.

2. The device of claim 1, wherein
the in-plane composition gradient refers to a condition in which a composition changes continuously from an element-rich region to an element-deficient region.

3. The device of claim 2, wherein
the element-rich region is thicker than the element-deficient region, and the thickness of the metal chalcogenide thin film continuously decreases from the element-rich region to the element-deficient region.

4. The device of claim 1, wherein
the metal chalcogenide thin film includes a composition represented by Formula 1:

$$M_{1-x}M'_xX_{2(1-y)}X'_{2y} \quad \text{[Formula 1]}$$

wherein M and M' are different transition metal elements, X and X' are different chalcogen elements, 0≤x<1, and 0≤y<1, and at least one of x and y is not 0.

5. The device of claim 4, wherein
the transition metal element is selected from Ti, Zr, Hf, V, Nb, Ta, Mo, W, Tc, Re, Co, Rh, Ir, Ni, Pd, Pt, Zn, and Sn, and
the chalcogen element is selected from S, Se, and Te.

6. The device of claim 1, wherein
each of the transition metal element and the chalcogen element shows an in-plane composition gradient.

7. The device of claim 6, wherein a composition gradient of the transition metal element and a composition gradient of the chalcogen element are perpendicular to each other along the upper surface of the metal chalcogenide thin film.

* * * * *

UNITED STATES PATENT AND TRADEMARK OFFICE
CERTIFICATE OF CORRECTION

| | | |
|---|---|---|
| PATENT NO. | : 12,297,532 B2 | Page 1 of 1 |
| APPLICATION NO. | : 18/332638 | |
| DATED | : May 13, 2025 | |
| INVENTOR(S) | : Kyung-Eun Byun et al. | |

It is certified that error appears in the above-identified patent and that said Letters Patent is hereby corrected as shown below:

On the Title Page

In the Assignee (item (73)), the Second Assignee listed is incorrect and should be listed as:
-- Research & Business Foundation Sungkyunkwan University --

Signed and Sealed this
Fifth Day of August, 2025

Coke Morgan Stewart
*Acting Director of the United States Patent and Trademark Office*